United States Patent [19]

Uhrey

[11] Patent Number: 4,680,485

[45] Date of Patent: Jul. 14, 1987

[54] QUAD-STATE CONTROL SIGNAL INPUT CIRCUIT

[75] Inventor: Marc K. Uhrey, Layton, Utah

[73] Assignee: Gould Inc., Rolling Meadows, Ill.

[21] Appl. No.: 747,075

[22] Filed: Jun. 19, 1985

[51] Int. Cl.[4] .................. G11C 8/00; H03K 17/56; G05F 5/00; H03L 7/00

[52] U.S. Cl. ....................... 307/463; 307/244; 307/511; 377/16; 328/55; 328/119; 328/154

[58] Field of Search ................ 328/152–154, 328/119, 55; 377/16; 307/241–244, 511, 463

[56] References Cited

U.S. PATENT DOCUMENTS 4,330,842 5/1982 Daniels et al. ................ 307/463
4,465,944 8/1984 Shin ................................ 307/473

OTHER PUBLICATIONS

"System for Encoding Digital Data" R. C. Lee, I.B.M. Tech. Disc. Bul. 1977.

Primary Examiner—Stanley D. Miller
Assistant Examiner—M. R. Wambach

[57] ABSTRACT

A quad-state input signal decoder 100 that decodes conventional three-state signals plus a fourth state in which the input signal 40 is at the frequency of, and synchronized with, a decode clock signal 35 in the decoder. Compared to three-state techniques, this invention achieves a one-third increase in the number of exclusively-active signals that can be communicated through a single line such as a I/O pin 41 of an integrated circuit 110.

12 Claims, 8 Drawing Figures

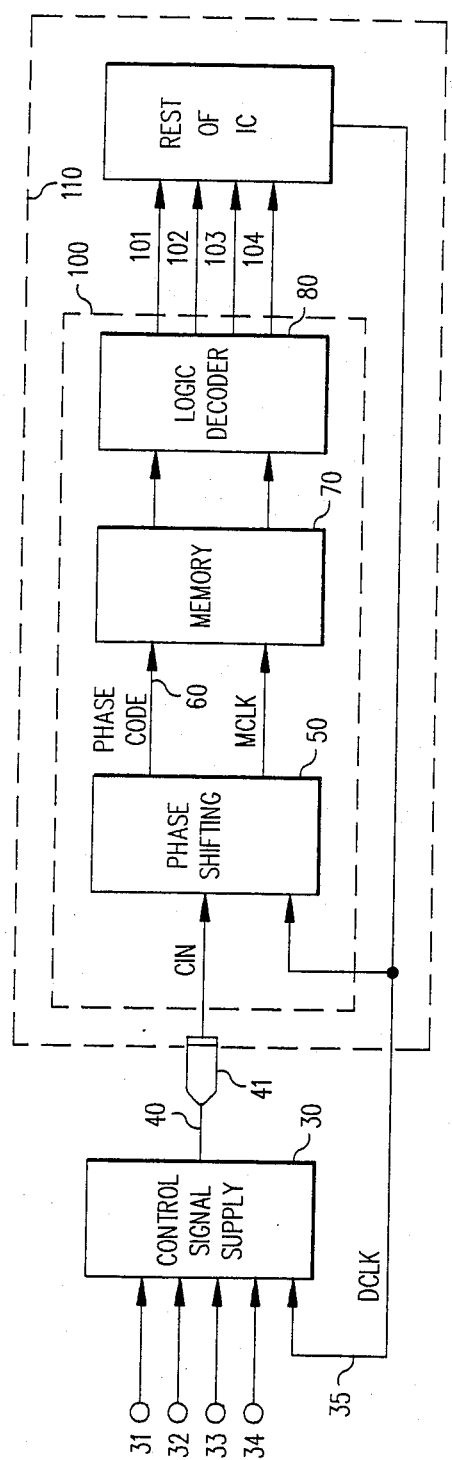
FIG. 1
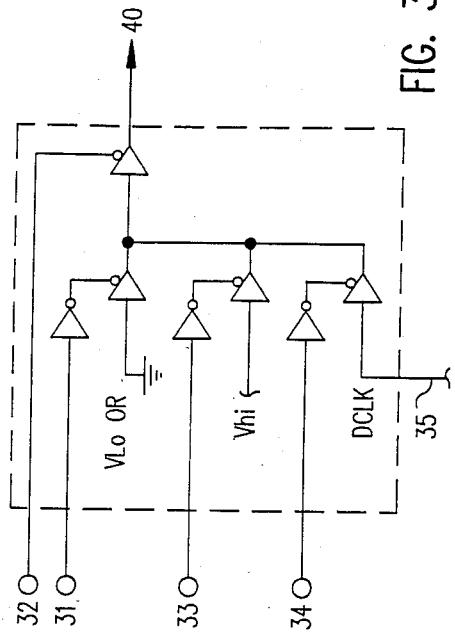
FIG. 3
FIG. 2

QUAD-STATE CONTROL SIGNAL INPUT CIRCUIT

BACKGROUND OF THE INVENTION

This invention relates to integrated circuits, and specifically to a decoder circuit which responds to a multi-state control signal received through a single input terminal, and to a clock signal, by producing a select signal at an output terminal which corresponds to the state of the control signal.

Very large scale integrated (VLSI) circuits include many circuit functions in one integrated circuit (IC) chip. Chips are encased in packages with terminals or "pins" along the sides. Signals are input and output for these circuit functions through the pins. As chip area increases at a given circuit (function) density, or as the density increases, the ratio of side length/functions decreases. Difficulties in accommodating the number of input-output (I/O) pins required for exchanging signals with such a VLSI circuit are therefore common. Using larger chips with more electrical contacts to external pins, and packages with more pins, in effect decreases the circuit density, and is unsatisfactory.

In one prior art approach to the pin scarcity problem, three or more discreet signal levels are used on an I/O pin. Detecting the third, intermediate level signals requires more complex and precise circuitry than detecting binary extremes. In another approach, signals are time multiplexed using serial data words and a clock to increment a counter which, for each bit of data word, sequentially selects an output line or mode of operation. The output lines are selectable sequentially in rotation, not randomly. These techniques are relatively complex and involve substantial system overhead.

A third prior art technique, disclosed for example in U.S. Pat. No. 4,465,944 to Shin, uses three-state signals. Three signals, only one of which will be "on" at a time, are combined into a three-state control signal having a value of either high voltage, low voltage, or "open" (high impedance). In the first two cases, the control signal is used by the input decoder circuit to override high and low reference signals, to constant high or low states. In the third case, the control signal is essentially disconnected and does not affect the reference signals. Still, there is a need for a more convenient way to communicate more than three exclusively selectable signals through a single pin.

BRIEF DESCRIPTION OF THE DRAWING

FIG. 1 is a block diagram of one embodiment of the control input circuit of the present invention used between four select lines of an IC, and an I/O pin of the IC connected to a control signal supply circuit;

FIG. 2 is a table indicating how the active or selected signal is transformed into a quad-state control signal.

FIG. 3 is a schematic diagram of one embodiment of control signal supply circuit 30 of FIG. 1;

SUMMARY

Figure 4:
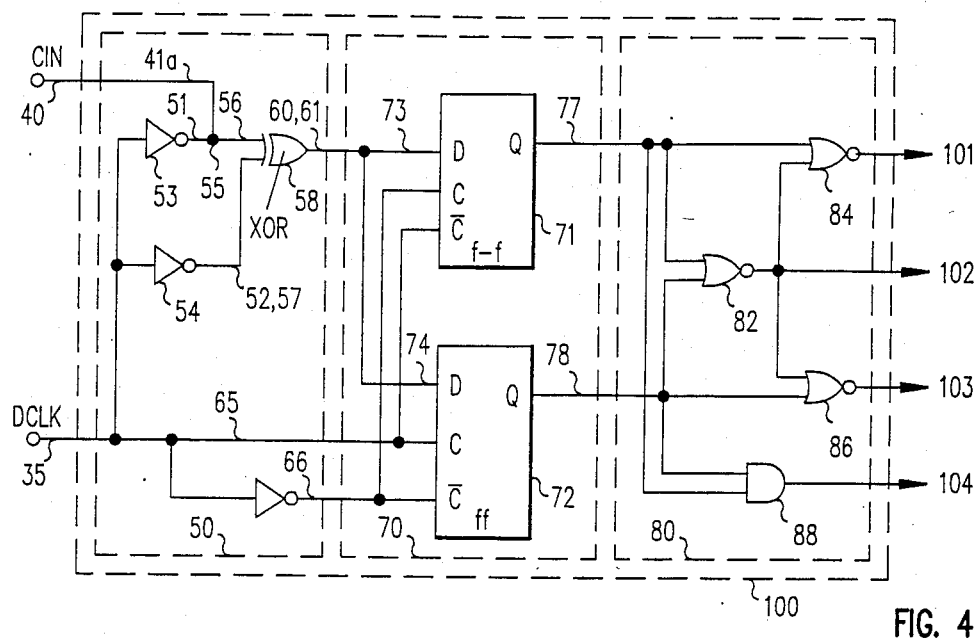
FIG. 4 is a more detailed schematic diagram of the control signal input circuit of FIG. 1.

It is therefore an object of this invention to reduce the number of pin terminals necessary for inputting certain select signals to an integrated circuit.

It is also an object to communicate up to four select signals through a single pin terminal.

Other objects include allowing the select signals to be activated in random order, and communicating select signals using binary voltage states and an open state.

The present invention achieves these and other objects by providing a method and a decoder circuit which use one pin of an integrated circuit to receive a timed quad-state control signal, and use a known clock signal to decode the control signal, once per clock period, to select a decoder output/IC input terminal corresponding to the state of the control signal.

The four select signals to be communicated are encoded, by a control signal supply circuit outside the IC, into a control signal, respectively as (1) a noneffective "open" signal,
(2) a constant first level signal,
(3) a constant second level signal, and
(4) an oscillating signal alternating at the clock frequency between the two levels.

The control signal is sent through the pin and received by the decoder circuit inside the IC. In the decoder, a phase shifting circuit uses the control signal to override a timing signal derived from the clock signal and to produce a phase code signal related to the clock signal by a phase relationship which contains the select information. In response to opposite direction clock signal transitions, a pair of memories alternately sample the phase code signal to capture the phase relationship. The sample values in the memories can be in four different combinations, which are decoded by a logic decoder to recover the select signal. The corresponding decoder output terminal is selected. This invention thereby alleviates the problem of physical bottlenecks at integrated circuit boundaries.

DETAILED DESCRIPTION

This invention is a quad-state control signal input circuit. It is useful where three or four select signals, only one of which can be active at a time, are to be applied to an integrated circuit having a limited number of input/output terminals or pins.

Referring to FIG. 1, the quad-state control signal input circuit 100 of the present invention is preferably part of an integrated circuit 110 and is situated between an input terminal or pin 41 of the IC and four select signal input terminals 101, 102, 103, 104 further inside the IC. The control input circuit 100 may be duplicated at other input pins, not shown, as desired to condense other select signals for input to IC 110.

Integrated circuit chips are operated by external circuits, not shown, which supply power to and exchange signals with the chip through the pins. The four select signals 31, 32, 33 and 34 to be communicated must first be encoded or condensed into a control signal CIN 40 by control signal driver or supply circuit external to chip 110. This condensing transforms the four select signals as indicated in the table of FIG. 2, and may be performed for example, by a control signal supply circuit 30 as shown in FIG. 3.

Control signal 40 is applied through chip input pin 41 (FIG. 1) which serves as the control signal input terminal of decoder 100. Phase shifting circuit 50 uses signal CIN 40 and a decode clock signal (DCLK) 35 (FIGS. 4 and 5a) from the chip to produce phase code signal 60 (FIGS. 5c, 5d, 5e and 5f), on phase shifting circuit output line 61.

Referring to FIG. 4, in the preferred embodiment, phase shifting circuit 50 includes a pair of inverting amplifiers 53 and 54 which derive equal first and second timing signals 51 and 52 (FIG. 5b), respectively, from DCLK signal 35. Control signal 40 overrides first timing signal 51 to produce controlled timing signal 56. If control signal 40 is in the non-effective "open" state, controlled timing signal 56 is the same as first timing signal 51. Control signal supply circuit 30 must have sufficiently high output impedance that the "open" state neither drains nor supplies enough current to upset the equality of timing signals 51 and 52. If the capacitance of control signal input line 41a is too high, when control signal 40 is in the open state, first timing signal 51 will phase lag second timing signal 52 (both should be FIG. 5b) enough to undesirably delay phase code signal 60 (beyond the next memory clock transistion).

If the control signal is in any of the other, effective states, controlled timing signal 56 has the value of control signal 40. Amplifiers 53 and 54 are necessary to buffer timing signals 51 and 52 from DCLK signal 35 and to prevent overriding control signal 40 from disturbing DCLK. Control signal input line 41a preferably includes a series resistance, typically 200 ohms, for electrostatic discharge protection of the IC. But, if the series resistance exceeds a critical value, determined by many factors, then the voltage divider effect, where input line 41a is connected between amplifier 53 and XOR gate 58, produces an invalid voltage for a "0" or "1" level input to the XOR gate. Amplifier 53 (and thus 54) must have a low or weak enough drive capability to be easily overridden by external supply circuit 30. The less drive capability amplifier 53 has, the higher its resistance to direct current flow is, or in other words, the more "resistive" the amplifier is. The more resistive amplifier 53 is, the less power it consumes, but the lower the frequency of DCLK and the switching frequency of CIN must be. Overdriving timing signal 51 to the level of CIN signal 40 increases the current draw of amplifier 53, but will not adversely affect an MOS (metal oxide semiconductor logic family) amplifier. However, a TTL (transistor-transistor logic family) amplifier would be damaged by overriding its output, and is not suited for the preferred embodiment of this invention. Amplifiers 53 and 54 also invert DCLK signal 35 in producing timing signals 51 and 52. In another embodiment, not shown, control signal CIN 40 is inverted instead of timing signals 51 and 52. Timing signals 51 and 52 must be equal to each other and the timing relationships described below must be respected.

The control signal information is indicated by the phase relationship of controlled timing signal 56 to the DCLK signal. Logically, this relationship could be identified by sampling the controlled timing signal during each half-period of DCLK, and decoding the four possible combinations of values from two consecutive period halves. This might be done simply by connecting the controlled timing signal 56 line 55 directly to the data (D) inputs 73 and 74 of the flip-flops, omitting XOR gate 58 and inverter 54. However, in practice this is unsatisfactory because chip input pin 41 should not be connected directly to IC "diffusion" areas, which the flip-flop D input terminals are. D input terminals 73 and 74 must be electrically isolated, via a high impedance gate, from input pin 41. An inverter inserted between line 55 and D-input line 61 would provide isolation, but controlled timing signal 56 must also be delayed relative to DCLK, as explained below, and an inverter does not provide adequate delay. Isolation and adequate delay are both provided by XOR gate 58, which requires a second input, provided by second timing signal 52, derived by amplifier 54 from DCLK.

For each of the types (FIG. 2) of control signal 40, XOR gate 58 produces a phase code signal 60, as shown in the timing diagrams of FIGS. 5c through 5f. A transition in DCLK signal 35 produces phase code signal 60, which, in response to the successive DCLK 35 transition, is sampled by one of the two bit stores 71 or 72 of memory 70. When races between timing signals 52 and 56 to XOR gate 58 cause transitions in the timing signals to be imprecisely combined, brief spikes or "glitches" appear in phase code signal 60. The output of "transparent" D-lactches changes as the input changes, but is latched when a clock signal is applied. This allows glitches to pass through to the output. Glitches are not a problem with full master-slave D flip-flops, which are, therefore, preferred over "transparent" D-latches for memory stores 71 and 72. Memory clock signal (MCLK) 65 (FIG. 5b) is taken directly from DCLK signal 35, or a delayed $\overline{MCLK}$ signal 66 may be used, as explained below. Opposite phase MCLK signals drive flip-flops 71 and 72 so that phase code signal 60 is not sampled by both flip-flops 71 and 72 during the same half-cycle of DCLK.

Figures 6, 7, 8:
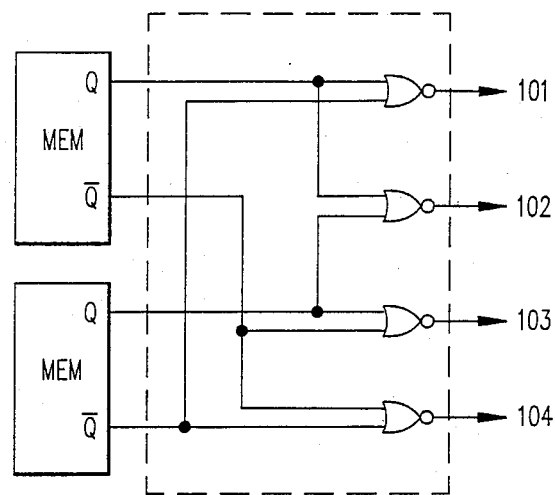
FIG. 6 is a truth table showing the possible combinations of values in the pair of memory stores and the corresponding output line selected by the logic decoder of FIG. 1.
FIG. 7 shows a logic decoder circuit used in an alternative embodiment of FIG. 1.
FIG. 8 is a truth table showing how the combinations of memory values are decoded by an alternative logic decoder circuit connected as in FIG. 7 but using AND gates instead of NOR gates.

The four possible combinations of samples in the flip-flops are decoded by logic decoder 80, according to the truth table of FIG. 6. In the preferred embodiment, logic decoder 80 uses only the Q outputs of the flip-flops, as in FIG. 4. In another embodiment, flip-flops with $\overline{Q}$ outputs are connected as in FIG. 7 using NOR gates. Alternatively, the connections of FIG. 7 can be used with AND gates replacing the NOR gates and decoding the combinations of memory values onto output lines according to the truth table of FIG. 8. The gate output line with the high signal is selected.

Figure 5:
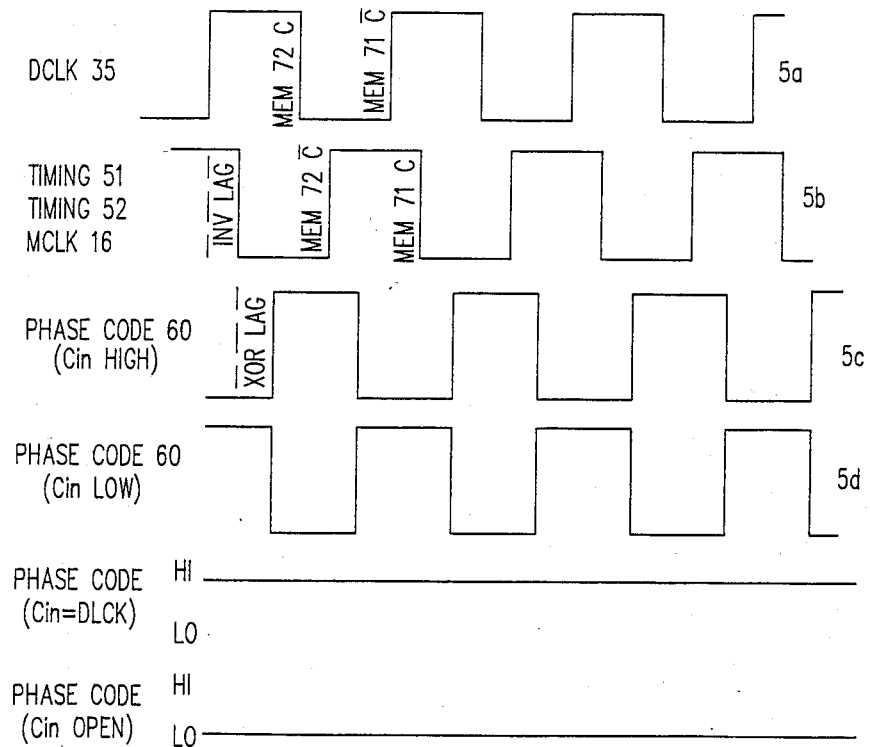
FIGS. 5a through 5f are timing diagrams showing the phase relationship between the clock signal and the timing and phase code signals produced by the phase shifting circuit of FIG. 4.

Referring to FIG. 5, phase code signal 60 must lag DCLK signal 35 to prevent DCLK signal from sampling a phase code signal simultaneously with initiating it. Some lag is assured by the propagation delay of XOR gate 58, which allows the former value of phase code signal 60 to remain unaffected while it is sampled by a new memory clock signal value, which also initiates a new phase code signal, and so on.

Variations in lag length shift the phase code signal relative to both the DCLK and MCLK clock signals. In the preferred embodiment, phase code signal 60 must lag memory clock signal 65 by less than one-half of a memory clock cycle. If the lag equals half of the MCLK 65 cycle, phase code signal 60 will be sampled as it is changing, with unreliable results. The lag of phase code signal 60 behind DCLK signal 35 is equal to the delay of amplifier (53 or 54) plus the delay of XOR gate 58. If faster select switching, and hence a higher memory clock frequency, are desired than this allows, the delay of phase code signal 60 can be offset by using an inverted and delayed $\overline{\text{DCLK}}$ signal for MCLK. Then the net delay of phase code signal 60 behind $\overline{\text{MCLK}}$ 66 is the delay of XOR gate 58. The preferred embodiment includes complementary MOS (CMOS) circuit elements, and uses both MCLK 65 and $\overline{\text{MCLK}}$ 66. Alternate embodiments including only NMOS or only PMOS circuit elements use just one of MCLK or $\overline{\text{MCLK}}$.

The four select signals may be switched in any order. The three select signals 31, 32 or 33 represented by a three-state (constant first level, constant second level, and open) control signal 40 may be switched at frequencies up to the DCLK frequency without regard for the DCLK phase. Quad-state operation, to decode encoded select signal 34, requires knowledge of the DCLK signal phase, to provide control signal 40 synchronously with DCLK signal 35 with a lag equal to the delay of amplifier 53. If an IC's internal clock signal (DCLK) is available externally, a chip tester, for example, may provide synchronization.

Input circuit 100 operates for each of the types of control signal, FIG. 2, as follows. While control input signal CIN 40 is in the "open" or high impedance state, it has essentially no effect on the control signal input circuit 100. Referring to FIG. 4, DCLK signal 35 is inverted equally by amplifiers 53 and 54 to produce first and second timing signals 51 and 52 (FIG. 5), which are applied equally to the input leads of XOR gate 58. XOR gate 58 continually outputs a zero or low level phase code signal 60 (FIG. 5f) to the D inputs 73 and 74 of flip-flops 71 and 72. On successive MCLK cycles, phase code 60 is sampled by each of the memories. The samples at the uninverted (Q) output leads 77 and 78 of flip-flops 71 and 72 are low.

The two low samples applied to NOR gate 82 produce a high or active select signal on output line 102. The samples are also applied, with line 102, to NOR gates 84 and 86, respectively, which causes those NOR gates to produce low value (deselect) signals on output lines 101 and 103. A low value sample in either of flip-flops 71 and 72 causes AND gate 88 to produce a low level deselect signal on output line 104.

If the power consumption of the IC is an important consideration, it is desirable to use the open state for the control signal default state, since overriding the controlled timing signal increases the current draw of the circuit. While the control signal is in the open state, pin 41 can serve as a DCLK (first timing signal) output, which is useful for various purposes. Since amplifier 53 is resistive (has a weak drive capacity), signal 51 must be buffered externally if used elsewhere.

A select signal 33 for line 103 is converted by control signal supply circuit 30 into a constant high control signal 40 which, when used to override first timing signal 51 has the effect of passing signal DCLK through XOR gate 58 unaffected except for the inverter and XOR lags (FIG. 5c). A high level DCLK signal 35 produces a high phase code signal 40 which is sampled by flip-flop 71 on the next falling edge in MCLK and/or by the next rising edge of $\overline{\text{MCLK}}$. A falling edge in DCLK signal 35 produces a low phase code signal 40 which is read by flip-flop 72 on the following rise in the MCLK signal. Thus, the sample in flip-flop 71 has a high value and the sample in flip-flop 72 has a low value. The high sample value output from flip-flop 71 is, in effect, inverted by NOR gate 82 to produce a low signal which, when applied with the low output signal of flip-flop 72 to the input leads of NOR gate 86, produces a high signal on select output line 103. The high signal on line 77 causes NOR gates 84 and 82 to output low signals on lines 101 and 102, respectively. Select line 104 is low in all cases where either flip-flop contains a low value sample.

The process for selecting line 101 is the inverse of that for selecting line 103. In this case, line 101 select signal 31 is converted into a constant low control signal 40, which holds the first timing signal 51 input to XOR gate 58 low. When DCLK is low, the second timing signal 52 is high and phase code signal 60 is high (FIG. 5d). The high phase code signal 60 is clocked into flip-flop 72 on the next rising edge of MCLK 65, and the low phase code 60 on the next falling edge. Thus, the sample in flip-flop 71 is low, and the sample in flip-flop 72 is high. NOR gate 82 inverts the output signal 102 of flip-flop 72 to low. Two low signals applied to NOR gate 84 select output line 101. The high sample from flip-flop 72 produces a low output signal 103 from NOR gate 86, and the low output signal from flip-flop 71 results in a low output signal 104 from AND gate 88.

The fourth possible sample combination is a high value in both flip-flops 71 and 72. This requires that phase code signal 60 (FIG. 5e) be high for both rising and falling transitions in the memory clock signal, which in turn requires that timing signals 56 and 52 always be opposite from each other. This is achieved by supplying the equivalent of DCLK as control signal 40, taking into account the delay of inverter 53. A high sample value in each of flip-flops 71 and 72 will produce low outputs from each of NOR gates 82, 84 and 86, deselecting lines 101, 102, and 103. The two high samples applied to AND gate 88 produce a high output from the AND gate, selecting output line 104. Output line 104 can be kept high indefinitely, pulsed, or selected at the same frequency as the other output lines.

A preferred embodiment has been illustrated, of which modifications and adaptations within the scope of the invention will occur to those skilled in the art. For example, decoder circuit 100 could be located outside of an IC, and be used to decode quad-state signals output from an IC for distribution to external circuits. The invention is limited only by the scope of the following claims.

I claim:

1. A circuit for decoding a control signal which uses high, low and open states to alternately represent any one of four select signals, comprising:
   the control signal input terminal for receiving a control signal;
   a clock signal source;
   four select output lines;
   a phase-shifting circuit for producing a phase code signal which is phase shifted from the clock signal as a function of the control signal;
   a memory connected to said phase-shifting circuit and having two bit stores which, in response to opposite and respective direction transitions in the clock signal, sample the phase code signal, and having respective output terminals for the sample values; and
   a logic decoder circuit connected to said memory and being responsive to the four possible combinations of memory samples to select a corresponding output line.

2. A circuit as in claim 1 further characterized in that:

the phase shifting circuit assigns the values of the clock signal to the open state of the control signal, and the function by which the phase shifting circuit produces a phase code signal phase shifted from the clock signal is: the delayed XOR sum of the clock signal and the control signal.

3. A circuit as in claim 2 further characterized in that: the phase shifting circuit buffers, inverts, and delays the clock signal to produce equal first and second timing signals, uses the high and low states of the control signal to override the first timing signal and provide a controlled timing signal, and applies the controlled timing signal and the second timing signal to an XOR gate which outputs the phase code signal.

4. A circuit as in claim 2 further characterized in that: said two bit stores sample the phase code signal in delayed response to transitions in the clock signal.

5. A circuit as in claim 4 further characterized in that: said two bit stores also sample the phase code signal in direct response to the clock signal.

6. A circuit as in claim 2 further characterized in that: said two bit stores comprise respective DQ flip-flops.

7. A circuit as in claim 6 further characterized in that: the DQ flip-flops also have $\overline{Q}$ output terminals.

8. A circuit as in claim 2 further characterized in that the circuit forms part of an integrated circuit on a chip and in that the control signal input terminal is an input terminal to the chip.

9. A circuit as in claim 2 further characterized in that: it includes complementary metal oxide semiconductor devices.

10. The method of using a first pin of an integrated circuit, which has a second pin connected to a clock source, to select one of four lines in the IC during each period of the clock, comprising the steps of:
   externally to the IC, encoding the four line select signals into a control signal respectively as
   (1) a noneffective signal,
   (2) a constant first level signal,
   (3) a constant second level signal, and
   (4) an oscillating signal alternating at the clock frequency between the two levels;
   sending the control signal through the first pin: and
   in the IC, deriving first and second timing signals, equally, from the clock signal;
   using the control signal to override the first timing signal, producing a controlled timing signal;
   XOR adding the controlled and second timing signals to produce, after a delay, a phase code signal;
   storing the phase code signal value in a first memory in response to the clock signal value rising, and in a second memory in response to the clock signal value falling, to obtain four possible combinations of the two values;
   decoding the combination to indicate the selected line.

11. The method of claim 10 further characterized in that:
   the oscillating control signal is the synchronized inverse of the timing signals.

12. The method of claim 11 further characterized in that:
   the phase code signal value is stored in delayed response to the clock signal value rising and falling.

* * * * *

UNITED STATES PATENT AND TRADEMARK OFFICE
CERTIFICATE OF CORRECTION

PATENT NO. : 4,680,485
DATED : July 14, 1987
INVENTOR(S) : Marc K. Uhrey

It is certified that error appears in the above-identified patent and that said Letters Patent is hereby corrected as shown below:

On the title page assignee should read

--(73) Assignee: American Microsystems, Inc.,
        Santa Clara, Calif. --.

Signed and Sealed this

Twenty-ninth Day of March, 1988

Attest:

DONALD J. QUIGG

*Attesting Officer*　　　*Commissioner of Patents and Trademarks*